United States Patent
Reddick et al.

[11] Patent Number: 5,237,295
[45] Date of Patent: Aug. 17, 1993

[54] PRINTED NETWORKS FOR IMPROVING ELECTRICAL ISOLATION AT HIGH FREQUENCIES

[76] Inventors: Donald W. Reddick, 3879 E. 135th Way, Thornton, Colo. 80241; Shan J. Lu, 11315 Lakeside Ave., NE., Seattle, Wash. 98125

[21] Appl. No.: 779,938

[22] Filed: Oct. 21, 1991

[51] Int. Cl.⁵ .............................................. H03H 7/38
[52] U.S. Cl. .................................. 333/131; 333/124; 333/119
[58] Field of Search ............... 333/131, 119, 124, 100, 333/126, 129, 134, 177, 125, 130; 361/392, 399

[56] References Cited

U.S. PATENT DOCUMENTS

| 3,673,517 | 6/1972 | Ticknor | 333/131 |
| 3,676,744 | 7/1972 | Pennypacker | 333/131 |

Primary Examiner—Paul M. Dzierzynski
Assistant Examiner—Ali Neyzari

[57] ABSTRACT

The invention is comprised of printed circuit boards having printed networks for improving electrical isolation at high frequencies. The invention provides more than 25 dB of isolation in the 1 GHz range. The invention is particularly useful for signal splitting applications. Multiple two way splitters, each made in accordance with the present invention, can be combined to form four way splitters, and so on.

9 Claims, 3 Drawing Sheets

PRINTED NETWORKS FOR IMPROVING ELECTRICAL ISOLATION AT HIGH FREQUENCIES

BACKGROUND OF THE INVENTION

The present invention relates to communications equipment. More particularly, the present invention relates to a printed circuit board which provides isolation in excess of 25 decibels (dB) in the 1 GHz range.

The ability to electrically isolate two circuits from each other is important. A first circuit is said to be isolated from a second circuit if the presence of the second circuit does not effect the output of the first circuit. Isolation is particularly important in the cable television industry where subscriptions to cable television are constantly added and deleted.

Currently, circuits are capable of providing approximately 17 dB to 20 dB of isolation at 1 GHz. At lower frequencies (e.g., less than 600 MHz) current circuits are capable of providing more than 25 dB of isolation. These current circuits typically use printed circuit boards having etched leads to aid in the amount of isolation. The present invention not only provides 25 dB of isolation in the lower frequency ranges, but also provides at least 25 dB of isolation in the 1 GHz range. The present invention attains improved electrical isolation in the 1 GHz range by using printed circuit boards having both etched leads and printed networks.

As a practical matter, improved isolation means better television reception for cable television subscribers. For instance, assume two neighbors subscribe to cable television and both televisions are connected to the same splitter. Further assume that the frequencies of operation are in the 1 GHz range and that one neighbor decides to cancel his/her cable television subscription. Once the subscription is cancelled, the one neighbor's television no longer acts as a node which serves to terminate the cable television signal. Thus, the signal can reflect onto the other neighbor's television set (with a slight time variation) causing "ghosting." Accordingly, a primary object of the invention is to provide a printed network which provides at least 25 dB of isolation in the 1 GHz range, which is unattainable by present isolation circuits.

Further objects and advantages of the present invention will become apparent in the following description.

SUMMARY OF THE INVENTION

The present invention provides a device useful for electrical isolation. The device is comprised of a printed circuit board and electrical components. The printed circuit board has a first side and a second side. One side of the printed circuit board is comprised of solder and etched leads. The other side of the printed circuit board is comprised of printed networks, solder, and electrical components. The printed networks enable the printed circuit networks of the present invention to provide a minimum of 25 dB of isolation in the 1 Ghz range.

DETAILED DESCRIPTION OF THE DRAWINGS

There is shown in the attached drawing a presently preferred embodiment of the present invention, wherein like numerals in the various views refer to like elements and wherein.

DETAILED DESCRIPTION OF THE PREFERRED EMBODIMENT

Figure 1:
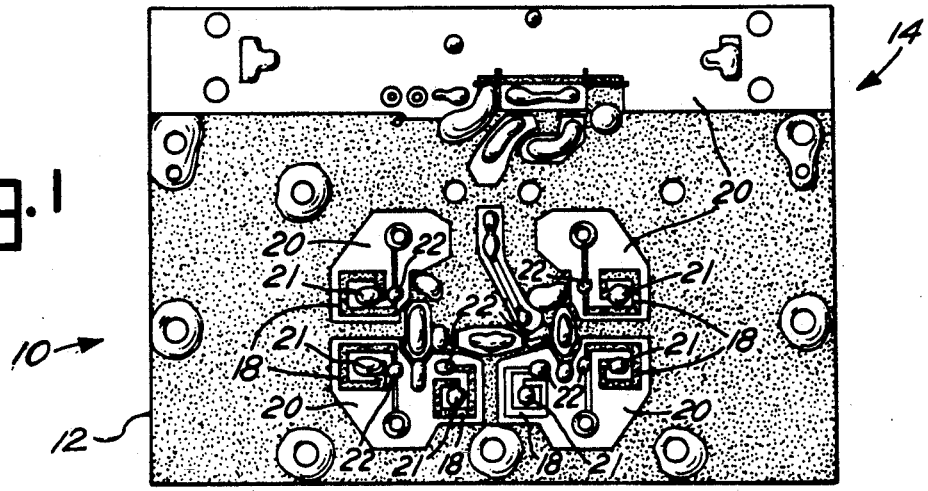
FIG. 1 is a view of one side of a four way splitter made in accordance with the present invention.
Figure 2:
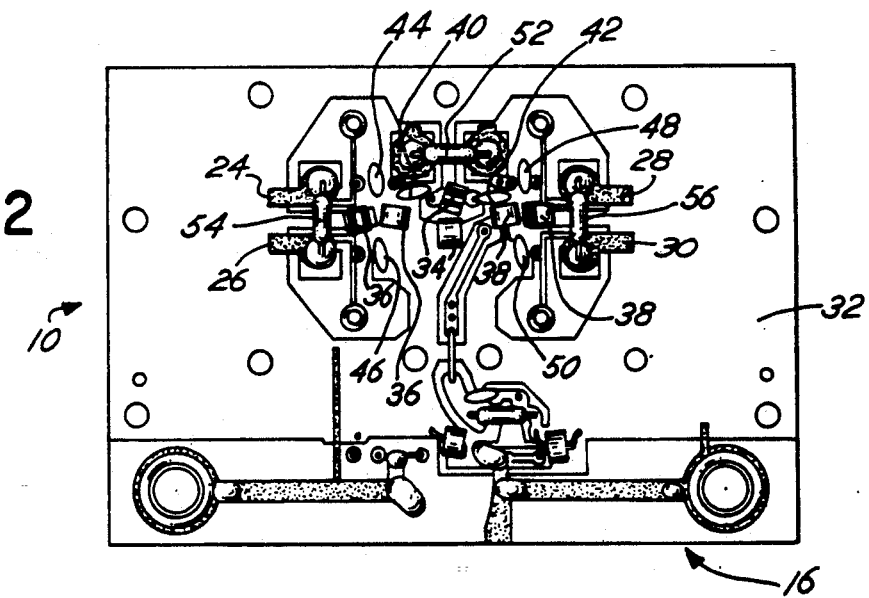
FIG. 2 is a view of the other side of a four way splitter made in accordance with the present invention.

Referring initially to FIG. 1, the four way splitter device 10, is comprised of a printed circuit board 12 having a first side 14 and a second side 16 (see FIG. 2). The first side 14 is comprised of etched leads 18 (e.g., conductive portions) and non-conductive portions 20. Each etched lead 18 has a first end 21 and a second end 22. Preferably, the etched leads 18 are spiral in shape. The second side 16 of the printed circuit board 12 of the four way splitter device 10 is comprised of four printed networks 24, 26, 28, and 30, each of which represents a separate output terminal on a four way splitter. The second side 16 of the printed circuit board 12 also has non-conductive portions 32. Further, the second side 16 of the printed circuit board 12 also has electrical components such as transformers 34, 36, and 38, capacitors 40, 42, 44, 46, 48, and 50, and resistors 52, 54, and 56 all connected as shown in FIG. 4. It should be noted that if only transformer 34, capacitors 40 and 42, and resistor 52 were on the second side 16 of the printed circuit board 12, the device would be a two way splitter (as shown in FIG. 3) rather than a four way splitter.

The detailed connections of a two way splitter will be described in the next paragraph. The paragraph after that will detail how to connect three two way splitters to form a four way splitter.

Figure 3:
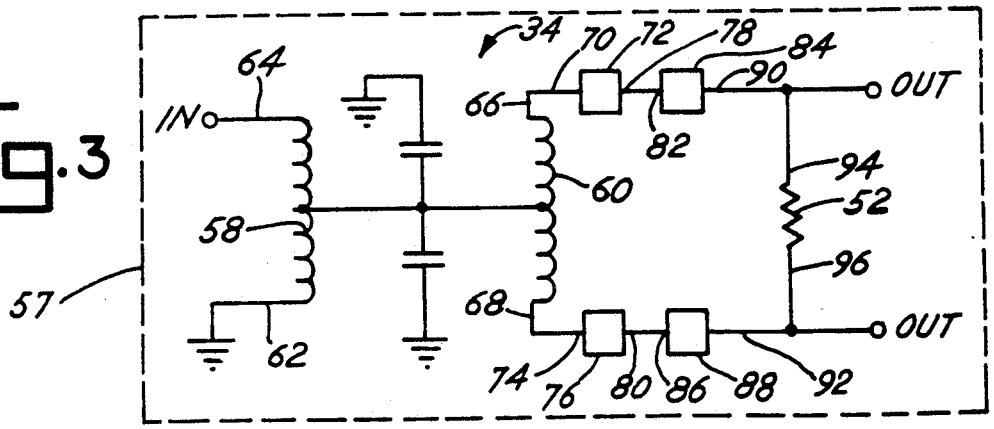
FIG. 3 is a schematic of a two way splitter made in accordance with the present invention.
Figure 4:
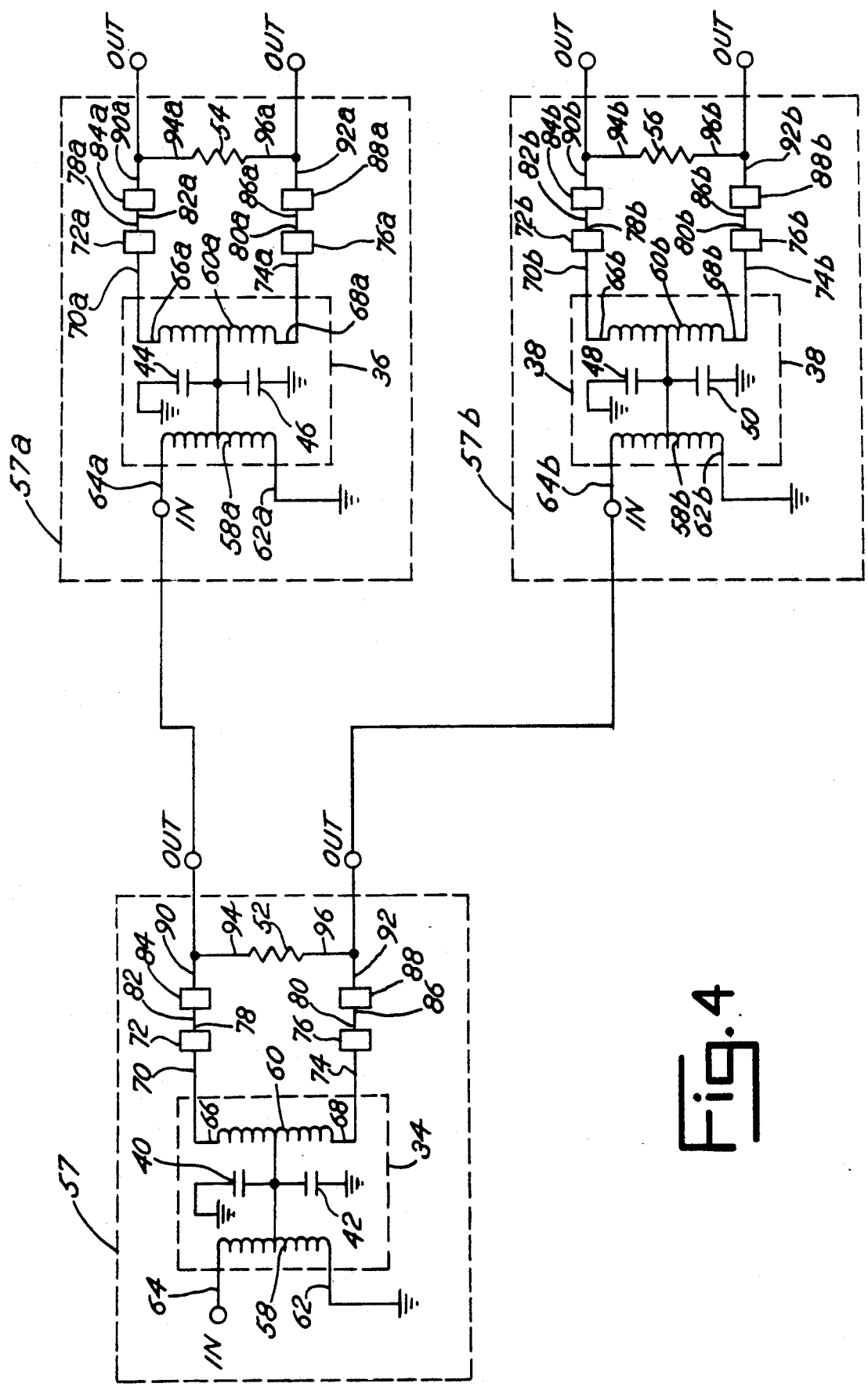
FIG. 4 is a schematic of a four way splitter made in accordance with the present invention.

FIG. 3 shows a schematic for a two way splitter made in accordance with the present invention. The transformer 34 has a primary winding 58 and a secondary winding 60. A first lead 62 of the primary winding 58 is grounded and a second lead 64 serves as the input terminal for the signal to be split. The secondary winding also has a first lead 66 and a second lead 68. The first lead 66 and the second lead 68 of the secondary winding 60 are connected to a second end 70 of a first etched lead 72 and a second end 74 of a second etched lead 76 (etched leads are also shown in FIG. 1 and generally denoted by the number 18), respectively. A first end 78 of the first etched lead 72 and a first end 80 of a second etched lead 76 are connected to a second end 82 of a first printed network 84 and a second end 86 of a second printed network 88, respectively. The first end 90 of the first printed network 84 and the first end 92 of the second printed network 88 are connected to a first end 94 of resistor 52 and a second end 96 of resistor 52, respectively. The first end 94 and the second end 96 may serve as output terminals. Thus, it is seen that the input placed on the second lead 64 of the primary winding 58 is split into two signals, one of which emanates from the first end 94 and the other of which emanates from the second end 96 of the resistor 52.

A four way splitter can be easily constructed by electrically connecting three two way splitters, 57, 57a, and 57b, as described above and shown in FIG. 4. All numbers shown in FIG. 4 ending in "a" or "b" are merely counterparts to two way splitter 57 that exist in the second two way splitter 57a and third two way splitter 57b, respectively. Essentially, the first end 94 of resistor 52 is connected to a second lead 64a of a primary winding 58a of transformer 36. Also, the second end 96 of resistor 52 is connected to a second lead 64b of a primary winding 60b of transformer 38. A second two way splitter 57a, which is partially comprised of transformer 36 and resistor 54, provides two of the four outputs of the four way splitter that are located at a first end 94a and a second end 96a of resistor 54. A third two way splitter 57b, which is partially comprised of transformer 38 and resistor 56, provides the other two outputs of the four way splitter that are located at a first end 94b and a second end 96b of resistor 56.

In the preferred form, the etched leads 18 (see FIG. 1), are spiral in shape. Further, in the preferred form, the printed networks cover a surface area of at least 0.4 square inches. The combination of the spiral shaped etched leads 18 and the printed networks provide isolation of greater than 25 dB at 1 GHz. This magnitude of isolation was unattainable prior to the current invention.

Figure 5:
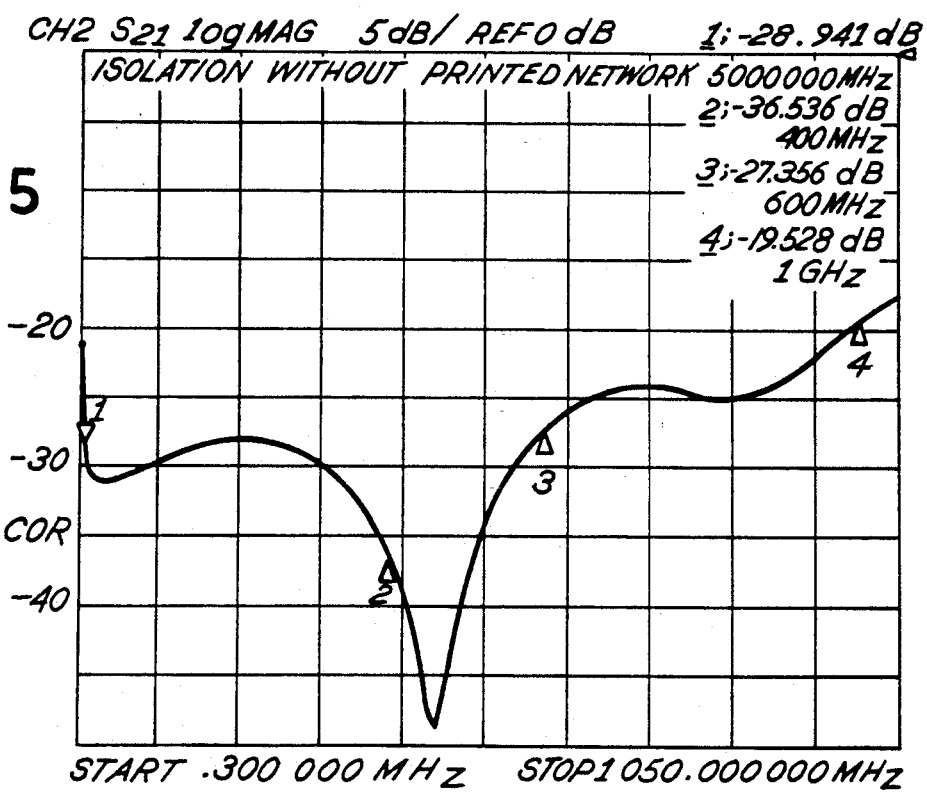
FIG. 5 is a graph of decibels versus frequency for a circuit without a printed network.
Figure 6:
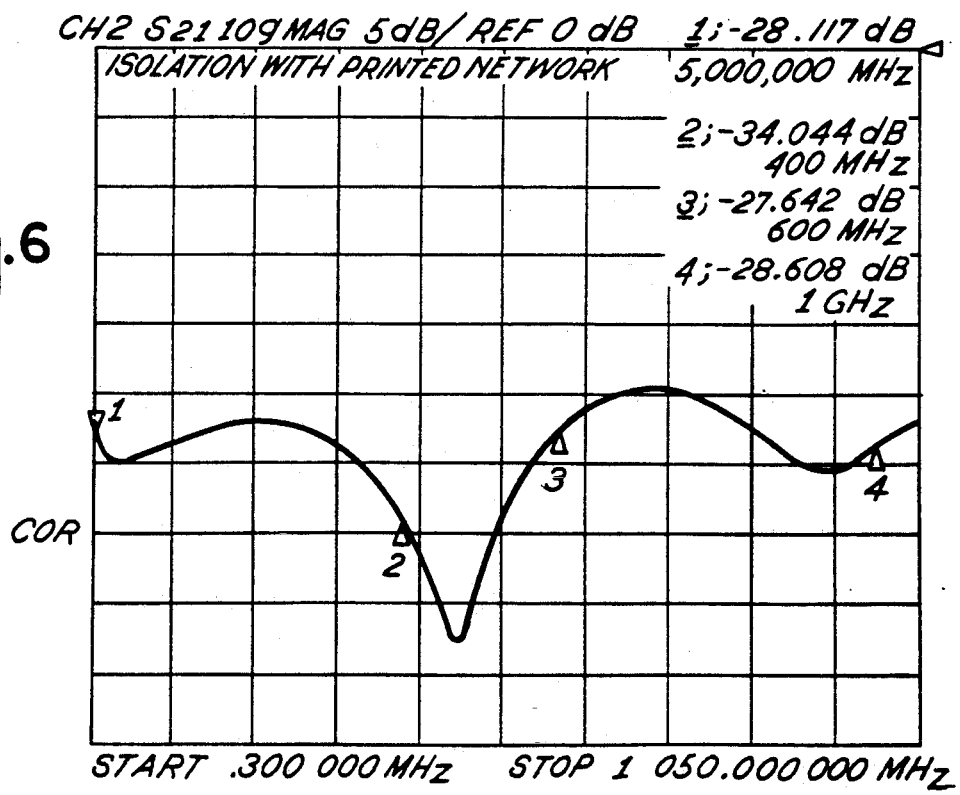
FIG. 6 is a graph of decibels versus frequency for a circuit with a printed network.

FIG. 5 shows the isolation attainable without a printed network in the frequency range of 0.3 MHz to 1050 MHz. Point 4 of FIG. 4 is the 1 GHz point. The isolation at point 4 was −19.528 dB. In contrast, FIG. 6 refers to isolation attainable with the printed network. The frequencies range from 0.3 MHz to 1050 MHz in FIG. 6. Point 4 of FIG. 6 is the 1 GHz point. The isolation at point 4 is −28.608 dB. Thus, the isolation between two loads (e.g., two televisions) is greatly improved in the 1 GHz range by using printed networks.

The invention has been described in detail, with particular reference to a printed circuit network 10. However, those skilled in the art understand that there are numerous variations and modifications of the present invention. For instance, the electrical components can be placed on either the first side 14 or the second side 16 of the printed circuit board 12. Additionally, some electrical components can be placed on the first side 14 while others are placed on the second side 16. An example of this would be placing the resistor 28 on the first side 14 of the printed circuit board 12. Further, those skilled in the art will realize that multiple (e.g., 3) printed circuit networks can be combined to form a four-way splitter, and so on.

While these are some of the variations and modifications which can be made to the present invention, those of ordinary skill in the art understand that other variations and modifications can be effected within the spirit and scope of the invention as described here and above and as defined in the appended claims.

What is claimed is:

1. A device for improving electrical isolation at high frequencies comprising:
   (a) a transformer having a primary winding and a secondary winding, the primary winding having a first lead and a second lead, the first lead being grounded and the second lead being an input terminal, the secondary winding having a first lead and a second lead:
   (b) a capacitive element coupled between the transformer and ground;
   (c) a resistor having a first lead and a second lead;
   (d) a first printed network having a first end and a second end, the first end of the first printed network being electrically connected to the first lead of the resistor and the second end of the first printed network being connected to the first lead of the secondary winding; and
   (e) a second printed network having a first end and a second end, the first end of the second printed network being electrically connected to the second lead of the resistor and the second end of the second printed network being connected to the second lead of the secondary winding, whereby a two way splitter is formed having the first lead of the resistor and the second lead of the resistor serve as outputs which are electrically isolated from each other by about 25 dB at a frequency of about 1 GHz;
   the foregoing device further comprising a first etched lead and a second etched lead, both the first and second etched leads having a first end and a second end, the first end of the first etched lead being connected to the second end of the first printed network, the second end of the first etched lead being connected to the first lead of the secondary winding, the first end of the second etched lead being connected to the second end of the second printed network, and the second end of the second etched lead being connected to the second lead of the secondary winding.

2. The device of claim 1 wherein the first printed network, the second printed network, the first etched lead, and the second etched lead are etched onto a printed circuit board.

3. The device of claim 2 wherein the first printed network and the second printed network are on a first side of the printed circuit board and the first etched lead and the second etched lead are on a second side of the printed circuit board.

4. The device of claim 3 wherein the resistor, the capacitive element, and the transformer are on the first side of the printed circuit board.

5. The device of claim 4 further comprising a second device as described as in claim 5 and a third device as described in claim 5, the second end of the primary winding of the transformer of the second device being connected to the first end of the resistor of the device of claim 5 and the second end of the primary winding of the third device being connected to the second end of the resistor of the device of claim 5 whereby a four way splitter is formed.

6. The device of claim 3 wherein the resistor, the capacitive element, and the transformer are on the second side of the printed circuit board.

7. The device of claim 2 wherein the first printed network, the second printed network, the first etched lead, and the second etched lead are etched onto a first side of the printed circuit board.

8. The device of claim 7 wherein the resistor, the capacitive element, and the transformer are on the first side of the printed circuit board.

9. The device of claim 7 wherein the resistor, the capacitive element, and the transformer are on a second side of the printed circuit board.

* * * * *

UNITED STATES PATENT AND TRADEMARK OFFICE
CERTIFICATE OF CORRECTION

PATENT NO. : 5,237,295
DATED : August 17, 1993
INVENTOR(S) : Donald W. Reddick

It is certified that error appears in the above-indentified patent and that said Letters Patent is hereby corrected as shown below:

On the Title page, item [73], Assignee: should read --Regal Technologies, Ltd., a corporation of Illinois--.

Signed and Sealed this

Fifth Day of April, 1994

BRUCE LEHMAN

*Attest:*

*Attesting Officer*   *Commissioner of Patents and Trademarks*